(12) United States Patent
Koo

(10) Patent No.: US 8,834,732 B2
(45) Date of Patent: Sep. 16, 2014

(54) PLASMA UNIFORMITY CONTROL USING BIASED ARRAY

(71) Applicant: Varian Semiconductor Equipment Associates, Inc., Gloucester, MA (US)

(72) Inventor: Bon-Woong Koo, Andover, MA (US)

(73) Assignee: Varian Semiconductor Equipment Associates, Inc.

( * ) Notice: Subject to any disclaimer, the term of this patent is extended or adjusted under 35 U.S.C. 154(b) by 64 days.

(21) Appl. No.: 13/662,018

(22) Filed: Oct. 26, 2012

(65) Prior Publication Data

US 2013/0052811 A1  Feb. 28, 2013

Related U.S. Application Data

(63) Continuation-in-part of application No. 12/244,017, filed on Oct. 2, 2008, now Pat. No. 8,329,055.

(51) Int. Cl.
| | |
|---|---|
| *C03C 15/00* | (2006.01) |
| *H01J 37/32* | (2006.01) |
| *C23C 14/48* | (2006.01) |
| *G21K 5/02* | (2006.01) |

(52) U.S. Cl.
CPC ........... *C23C 14/48* (2013.01); *H01J 37/32706* (2013.01); *H01J 37/32623* (2013.01); *G21K 5/02* (2013.01); *H01J 37/32412* (2013.01)
USPC ....................................... 216/71; 315/111.21

(58) Field of Classification Search
CPC ............. H05H 1/02; H05H 1/16; H01J 37/32; H01J 37/32009; H01J 37/32027; H01J 37/32412; H01J 37/32431; H01J 37/32532; H01J 37/32541; H01J 37/32633; H01J 37/32715

USPC .............. 315/111.21, 111.41; 216/63, 67, 71; 118/723 I, 723 E, 728
See application file for complete search history.

(56) References Cited

U.S. PATENT DOCUMENTS

| | | | | |
|---|---|---|---|---|
| 7,909,961 | B2 * | 3/2011 | Kumar et al. | 156/345.3 |
| 2005/0241767 | A1 * | 11/2005 | Ferris et al. | 156/345.35 |
| 2006/0000802 | A1 * | 1/2006 | Kumar et al. | 216/67 |
| 2006/0000805 | A1 * | 1/2006 | Todorow et al. | 216/68 |
| 2007/0017898 | A1 * | 1/2007 | Kumar et al. | 216/67 |
| 2008/0099431 | A1 * | 5/2008 | Kumar et al. | 216/44 |
| 2008/0101978 | A1 * | 5/2008 | Ryabova et al. | 419/54 |
| 2008/0178805 | A1 * | 7/2008 | Paterson et al. | 118/723.1 |
| 2009/0029564 | A1 * | 1/2009 | Yamashita et al. | 438/788 |
| 2011/0272099 | A1 * | 11/2011 | Kroll et al. | 156/345.33 |

* cited by examiner

*Primary Examiner* — Thuy Vinh Tran

(57) ABSTRACT

A technique for processing a workpiece is disclosed. In accordance with one exemplary embodiment, the technique is realized as a method for processing a substrate, where the method comprises: providing the workpiece in the chamber; providing a plurality of electrodes between a wall of the chamber and the workpiece; generating a plasma containing ions between the plurality of electrodes and the workpiece, ion density in an inner portion of the plasma being greater than the ion density in an outer portion of the plasma portion, the outer portion being between the inner portion and the wall of the chamber; and providing a bias voltage to the plurality of electrodes and dispersing at least a portion of the ions in the inner portion until the ion density in the inner portion is substantially equal to the ion density in the periphery plasma portion.

20 Claims, 10 Drawing Sheets

Ion Density vs. Distance from Center

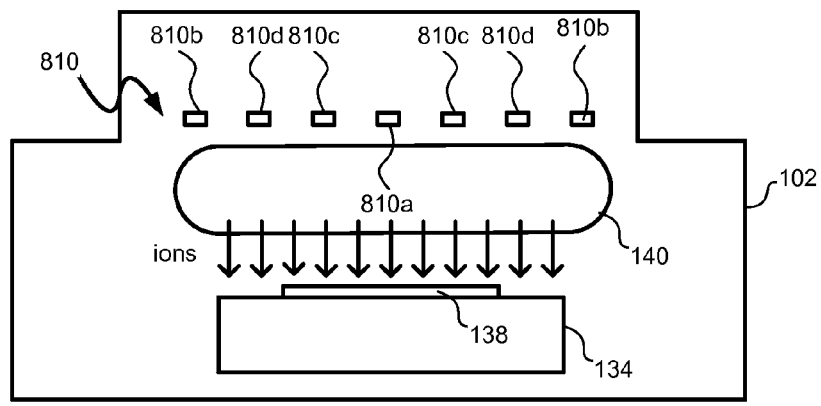
FIG. 8A
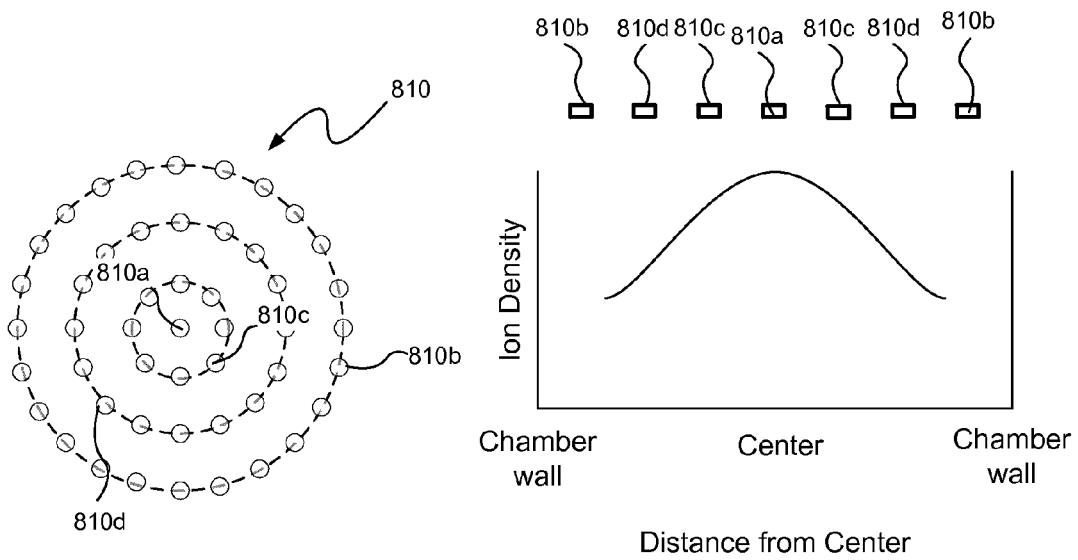
FIG. 8B
FIG. 8C

# PLASMA UNIFORMITY CONTROL USING BIASED ARRAY

PRIORITY

This application is a continuation-in-part application of and claims priority to U.S. Non-provisional patent application Ser. No. 12/244,017, filed on Oct. 2, 2008, entitled "Plasma Uniformity Control Using Biased Array." The entire specification of U.S. Non-provisional patent application Ser. No. 12/244,017, is incorporated herein by reference.

FIELD

The present disclosure is related to semiconductor manufacturing, particularly to semiconductor manufacturing using plasma.

BACKGROUND

Ions are commonly implanted into a substrate in ion implantation processes to produce semiconductor devices. These ion implantations may be achieved in a number of different ways. For example, a beam-line ion implantation system may be used to perform the ion implantation process. In the beam-line ion implantation system, an ion source is used to generate ions, which are manipulated in a beam-like state, and then directed toward the wafer. As the ions strike the wafer, they dope a particular region of the wafer. The configuration of doped regions defines their functionality, and through the use of conductive interconnects, these wafers can be transformed into complex circuits.

In another example, a plasma containing ions may be generated near the substrate. A voltage is then applied to the substrate to attract ions toward the substrate. This technique is known as plasma doping ("PLAD") or plasma immersion ion implantation ("PIII") process. FIG. 1 shows an exemplary plasma doping system 100. The plasma doping system 100 includes a process chamber 102 defining an enclosed volume 103. Within the volume 103 of the process chamber 102, a platen 134 and a workpiece 138, which is supported by the platen 134, may be positioned.

A gas source 104 provides a dopant gas to the interior volume 103 of the process chamber 102 through the mass flow controller 106. A gas baffle 170 is positioned in the process chamber 102 to deflect the flow of gas from the gas source 104.

The process chamber 102 may also have a chamber top 118 having a dielectric section extending in a generally horizontal direction and another dielectric section extending in a generally vertical direction.

The plasma doping system may further include a plasma source 101 configured to generate a plasma 140 within the process chamber 102. The source 101 may include a RF power source 150 to supply RF power to either one or both of the planar antenna 126 and the helical antenna 146 to generate the plasma 140. The RF source 150 may be coupled to the antennas 126, 146 by an impedance matching network 152 that matches the output impedance of the RF source 150 to the impedance of the RF antennas 126, 146 in order to maximize the power transferred from the RF source 150 to the RF antennas 126, 146.

The plasma doping system 100 also may include a bias power supply 148 electrically coupled to the platen 134. The bias power supply 148 may provide a continuous or a pulsed platen signal having pulse ON and OFF time periods to bias the workpiece 138. In the process, the ions may be accelerated toward the workpiece 138. The bias power supply 148 may be a DC or an RF power supply.

In operation, the gas source 104 supplies a dopant gas containing a desired dopant species to the chamber 102. To generate the plasma 140, the RF source 150 resonates RF currents in at least one of the RF antennas 126, 146 to produce an oscillating magnetic field. The oscillating magnetic field induces RF currents into the process chamber 102. The RF currents in the process chamber 102 excite and ionize the primary dopant gas to generate the plasma 140.

The bias power supply 148 provides a pulsed platen signal to bias the platen 134 and, hence, the workpiece 138 to accelerate ions from the plasma 140 toward the workpiece 138. The frequency of the pulsed platen signal and/or the duty cycle of the pulses may be selected to provide a desired dose rate.

The above technique is known to provide high implant throughput. However, the uniformity of the dose is difficult to control. In the beam-line ion implantation system, components such mass analyzer magnets, deceleration electrodes and other beam-line components may be used to manipulate ions into a uniform ion beam, and the workpiece may be uniformly implanted with ions in the uniform ion beam. Such components, however, are not available with a plasma doping system. To uniformly implant the workpiece in the plasma doping system, the plasma generated near the substrate should be uniform, as PLAD implant uniformity is closely related to plasma uniformity.

In a typical plasma based system, the generated plasma is typically non-uniform; the plasma density is typically higher in the center of the plasma than near the chamber walls, as shown in FIG. 4. As a result, implant profile on the workpiece shows a similar non-uniform profile—higher implant dose in the middle, and lower dose in the edges of the workpiece. Typically, RF power, gas flow and distribution, magnetic confinements, etc. may be adjusted to improve the plasma uniformity. However, such techniques may mitigate the plasma non-uniformity, but cannot change the generic non-uniform density profile shown in FIG. 4.

As such, systems and methods to improve the uniformity of the plasma in a plasma based system are needed.

SUMMARY

A technique for processing a workpiece is disclosed. In accordance with one exemplary embodiment, the technique may be realized as a method for processing a substrate. The method may comprise: providing the workpiece in the chamber; providing a plurality of electrodes between a wall of the chamber and the workpiece; generating a plasma containing ions between the plurality of electrodes and the workpiece, ion density in an inner portion of the plasma being greater than the ion density in an outer portion of the plasma portion, the outer portion being between the inner portion and the wall of the chamber; and providing a bias voltage to the plurality of electrodes and dispersing at least a portion of the ions in the inner portion until the ion density in the inner portion is substantially equal to the ion density in the periphery plasma portion.

In accordance with other aspects of this particular exemplary embodiment, the method may further comprise attracting ions to the workpiece from the inner and outer portions of the plasma.

In accordance with further aspects of this particular exemplary embodiment, the providing the bias voltage to the plurality of electrodes may comprise independently biasing the plurality of electrodes.

In accordance with additional aspects of this particular exemplary embodiment, the providing the bias voltage to the plurality of electrodes may comprise positively biasing the plurality of electrodes.

In accordance with further aspects of this particular exemplary embodiment, the providing the bias voltage to the plurality of electrodes may comprise negatively biasing the plurality of electrodes.

In accordance with other aspects of this particular exemplary embodiment, the method may further comprise: coupling the plurality of electrodes to one or more power supplies, where the one or more power supplies may provide a pulsed bias voltage having a duty cycle.

In accordance with further aspects of this particular exemplary embodiment, the method may further comprise: adjusting the duty cycle of the pulsed bias voltage provided to the plurality of electrodes.

In accordance with additional aspects of this particular exemplary embodiment, the method may further comprise providing a magnetic field in same direction as an electric field created by the biasing the plurality of electrodes.

In accordance with other aspects of this particular exemplary embodiment, the plurality of electrodes may comprise a first electrode disposed near the inner portion of the plasma and a second electrode disposed near the outer portion of the plasma, and where the first electrode may be applied with a first bias voltage and the second electrode is applied with a second bias voltage.

In accordance with further aspects of this particular exemplary embodiment, the first bias voltages may be more positive than the second bias voltage.

In accordance with additional aspects of this particular exemplary embodiment, the first bias voltage may be less positive than the second bias voltage.

In accordance with another exemplary embodiment, the technique may be realized as a method for processing a workpiece. The method may comprise: providing the workpiece in a plasma chamber; providing first and second electrodes between a wall of the plasma chamber and the workpiece; generating a plasma containing ions between the plurality of electrodes and the workpiece, the plasma may comprise a first plasma portion disposed near the first electrodes and a second plasma portion disposed near the second electrode, where the first plasma portion may have a greater ion density than the second plasma portion; providing a bias voltage to the first and second electrodes and dispersing at least a portion of the ions in the first plasma portion until the ion density in the first plasma portion is substantially equal to the ion density in the second plasma portion; and biasing the workpiece and attracting ions to the workpiece from the first and second portions of the plasma having substantially equal ion density.

In accordance with other aspects of this particular exemplary embodiment, the first plasma portion may be disposed near a middle of the plasma and the second plasma portion may be disposed near a periphery of the plasma next to the first plasma portion.

In accordance with further aspects of this particular exemplary embodiment, the second plasma portion may be disposed near a middle of the plasma and the first plasma portion is disposed near a periphery of the plasma next to the second plasma portion.

In accordance with additional aspects of this particular exemplary embodiment, the providing the bias voltage to the first and second electrodes comprises independently biasing at least one of the plurality of electrodes.

In accordance with further aspects of this particular exemplary embodiment, the providing the bias voltage to the first and second electrodes may comprise positively biasing at least one of the plurality of electrodes.

In accordance with additional aspects of this particular exemplary embodiment, the providing the bias voltage to the first and second electrodes may comprise negatively biasing at least one of the plurality of electrodes.

In accordance with further aspects of this particular exemplary embodiment, the providing the bias voltage to the first and second electrodes may comprise biasing the first electrodes with a first bias voltage and the second electrodes with a second bias voltage.

In accordance with other aspects of this particular exemplary embodiment, the first bias voltage may be more positive than the second bias voltage.

In accordance with additional aspects of this particular exemplary embodiment, the first bias voltage is less positive than the second bias voltage.

In accordance with another exemplary embodiment, the technique may be realized as a method for processing a workpiece. The method may comprise: providing the workpiece in a plasma chamber; providing first and second electrodes between a top of the plasma chamber and the workpiece; generating a plasma between the plurality of electrodes and the workpiece, where the plasma may comprise first and second portions having different plasma density; independently applying bias voltage first and second electrodes until the difference in the plasma density of the first and second portion of the plasma is reduced.

In accordance with additional aspects of this particular exemplary embodiment, more positive bias voltage is applied to one of the first and second electrodes near first and second portions the bias voltage applied to one of the first and second electrodes near one of the first and second portions of the plasma with greater plasma density to improve uniformity of the plasma density between the first and second portions.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 8A illustrates another exemplary apparatus according to another embodiment of the present disclosure.

FIG. 8B illustrates a plurality of exemplary electrodes incorporated in the apparatus shown in FIG. 8A.

FIG. 8C illustrates an exemplary operation of the apparatus shown in FIG. 8A.

DETAILED DESCRIPTION

Herein, several embodiments of an apparatus and method for achieving uniform plasma density are disclosed with reference to accompanying drawings. The detailed disclosure contained herein is intended for illustration, for better understanding the disclosure, and not a limitation thereto. For example, the disclosure may be made with reference to a plasma doping or a plasma immersion ion implantation system. However, the present disclosure may be equally applicable to other plasma based systems including plasma based etching and deposition systems.

Figure 4:
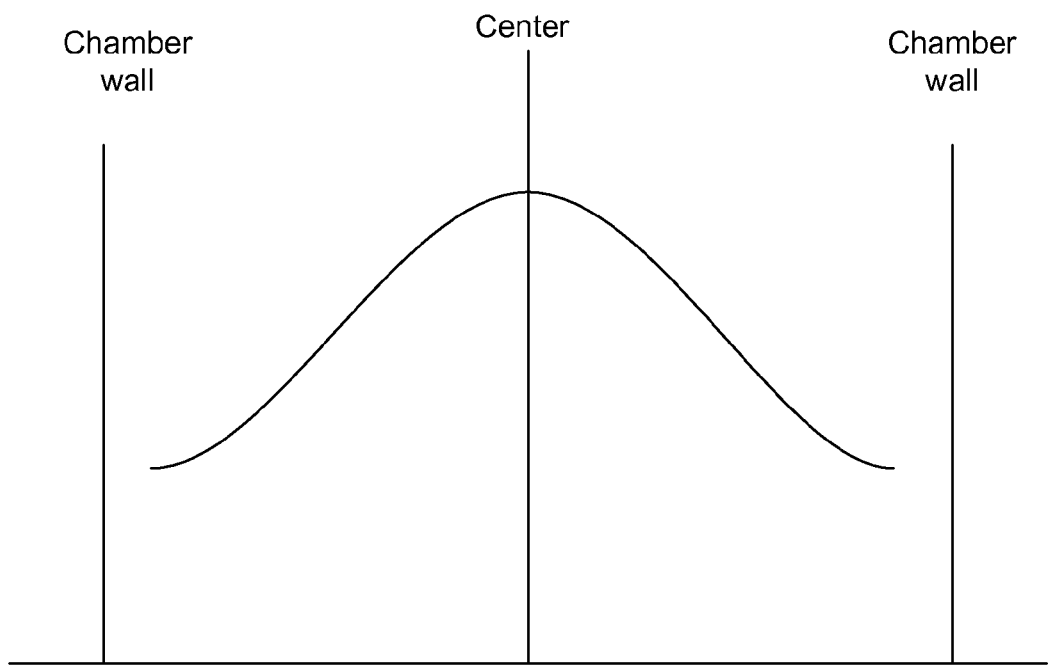
FIG. 4 represents a graph illustrating typical ion density profile in a plasma tool.

As described above, a plasma doping system is used to create a plasma in close proximity to the workpiece. The workpiece may be then biased to a certain electrical potential. However, the plasma density or the ion concentration within the generated plasma may be non-uniform. Typically, the concentration of ions is the highest near the center and lower near the chamber wall, as shown in FIG. 4.

In a plasma based system that is radially symmetric, the ion diffusion pattern may also be radially symmetric along the horizontal direction. As such, the plasma generated in a radially symmetric plasma based system may have approximately concentric density profile. Ion concentration at a point removed from the center of the plasma may be approximately the same as another point equidistanced from the center. Such a characteristic in symmetric plasma based system may result in a dome shaped plasma density profile.

Plasma is a quasi-neutral state where positively and negative charged particles show collective behaviors. Charged particles in the plasma are responsive to both electrical and magnetic fields. By using these fields to manipulate the local distribution of the charged particles within the plasma, the implant uniformity can be improved. FIG. 2 represents a first embodiment of the apparatus. In this figure, many of the components in the plasma doping system of FIG. 1 have not been included in FIG. 2 for purpose of clarity and simplicity. However, it should be understood that the components shown in FIG. 1 may also be in the plasma doping system.

Figure 1:
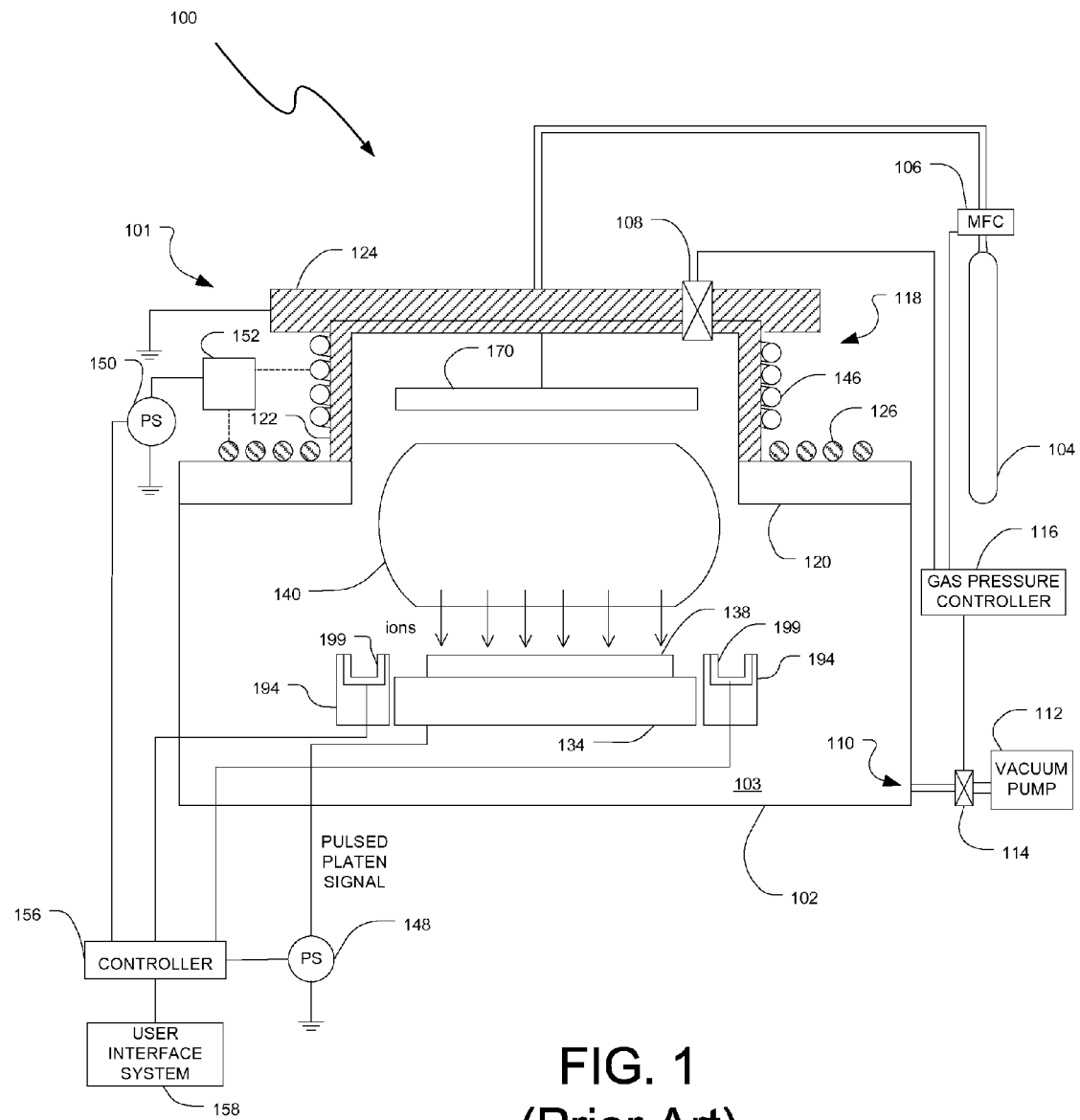
FIG. 1 represents a traditional plasma doping system.
Figure 2:
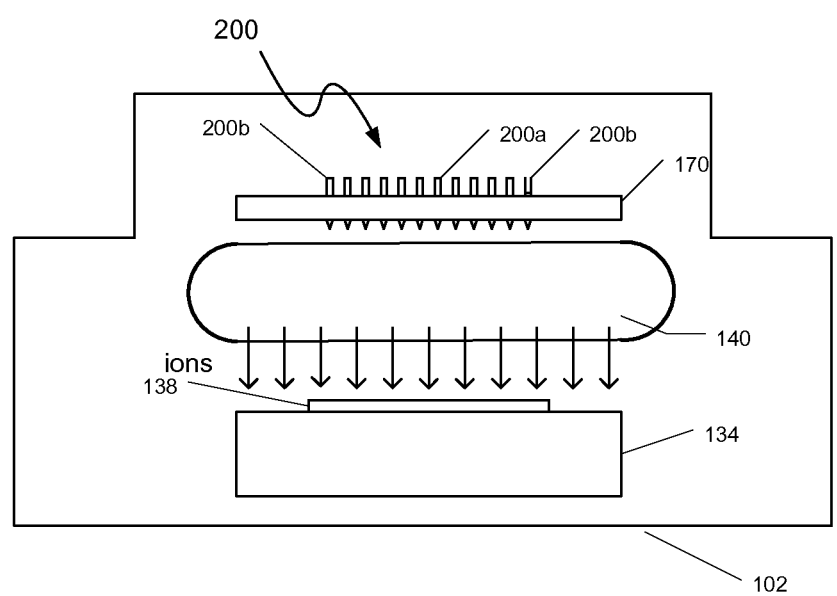
FIG. 2 represents a first embodiment of the apparatus of the present disclosure.

Referring to both FIGS. 1 and 2, the plasma 140 may be positioned between the workpiece 138 and the baffle 170. The baffle 170 can be a stationary baffle 170 and/or adjustable baffle 170. The adjustable baffle 170 can move in a vertical direction (up and down) relative to the wafer or the chamber ceiling. This movement may occur prior to and/or during wafer processing. Periodic pulses of bias voltage at the workpiece may be applied to accelerate ions toward the workpiece. However, as seen in FIGS. 1 and 2, there are no mechanisms to confine the plasma or control its uniformity. In one embodiment, a set of electrical conductors 200 is preferably located on the underside of the baffle 170 such that the conductors 200 may be positioned above the plasma. These conductors may preferably be electrically insulated from one another and from the baffle. For example, an insulating material (not shown) may separate the conductors 200 from one another and from the baffle 170. In another embodiment, the electrical conductors 200 may be disposed around the plasma (e.g. the side of the plasma). Yet in another embodiment, a set of electrical conductors 200 may be disposed above the plasma and another set of electrical conductors 200 may be disposed around the plasma.

Figure 3:
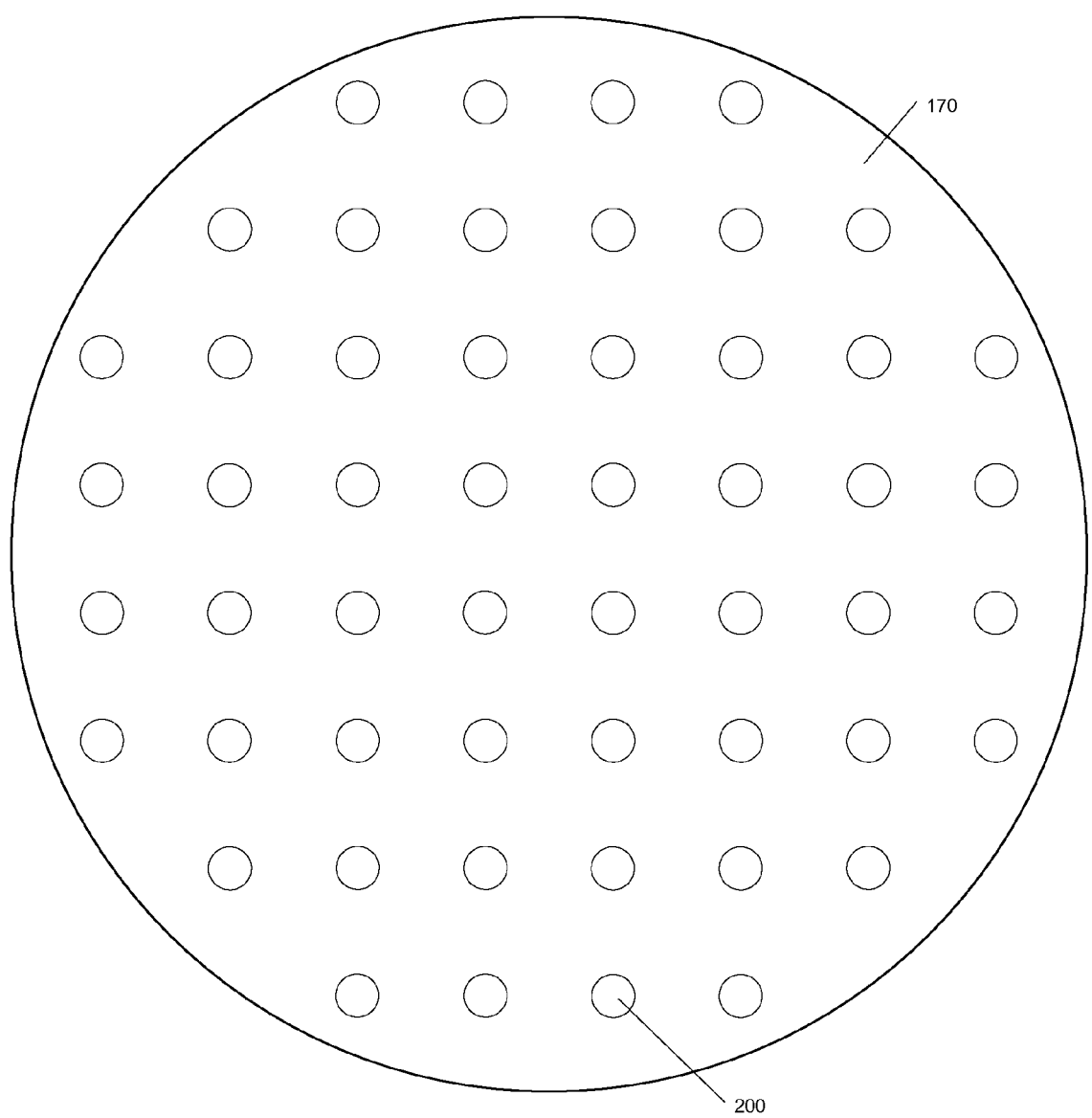
FIG. 3 represents a top view of the apparatus shown in FIG. 2.

In the present embodiment, the electrical conductors 200 may be pins 200. However, those or ordinary skill in the art will recognize that the electrical conductors 200 may be other types of conductor 200. In addition, the electrical conductors may have diameters of other values. In the present embodiment, the pins 200 may preferably be arranged in a two-dimensional array, as shown in FIG. 3.

In a plasma doping system, the plasma may have a cylindrical shaped volume, having a diameter of about 50 cm and a height of about 10-20 cm. Thus, if the two-dimensional array is to extend over the plasma region, and the distance between adjacent pins is about 1.0 cm, then the array may contain about 304 pins. However, those of ordinary skill in the art will recognize that the number of the pins in the array may be more or less. For example, if the array of the pins covers the 300 mm wafer region with the distance between adjacent pins of 2.54 cm, then the array would contain only about 110 pins.

Additionally, the electrical conductors can be various shapes including rectangular, square, round or other shapes. The most preferred shapes include (1) a flat cylindrical shape (0.1-1.0 cm in diameter) and (2) a pointed-tip cylindrical shape (0.05 cm or less in diameter for pointed tip, 0.1-1.0 cm in diameter for the pin body). For the latter case, the total angle of the pointed-tip may be less than 90 degrees.

Each of these pins may be independently controlled. For example, each pin may be biased to a voltage independent of other pins. Furthermore, each pin may be biased either positively or negatively. Finally, these bias voltages may be constant, or pulsed. In addition, the bias voltages may vary between conductors. Furthermore, the magnitude of the bias voltage at a particular conductor may vary over time. Thus, the two-dimensional array may be used to create any desired electrical field, and that field can be static or may vary.

By creating an electrical field potential above the plasma, the ion concentration within the plasma can be altered. For example, the use of a positive bias voltage will draw the electrons within the plasma toward those positively biased pins. The magnitude of that bias voltage may determine the size of the affected field. By drawing the electrons toward the upper portion of the plasma, the positive ions may disperse due to space charge effects. Such a dispersion of the positive ions may change the positive ion distribution within the plasma. Therefore, the dispersion may locally lower the concentration of implanted ions when the substrate bias voltage is applied. Negative bias voltages on the pins may have different effect. The negative voltage may repel the electrons and thereby cause the plasma to be locally compressed. This compression increases the local concentration of positive ions near the workpiece.

FIG. 4 shows a typical graph of the ion concentration as compared to the distance from the center of the system along one axis. Although this shows ion concentration versus distance in one dimension, similarly shaped graphs exist in all dimensions. Thus, by applying positive bias voltage near the center of the system, the ion concentration can be lowered, thereby improving uniformity. Additionally, applying negative bias voltage near the outer portions of the plasma compresses the plasma, and therefore effectively increases its concentration, further improving uniformity.

Figure 7:
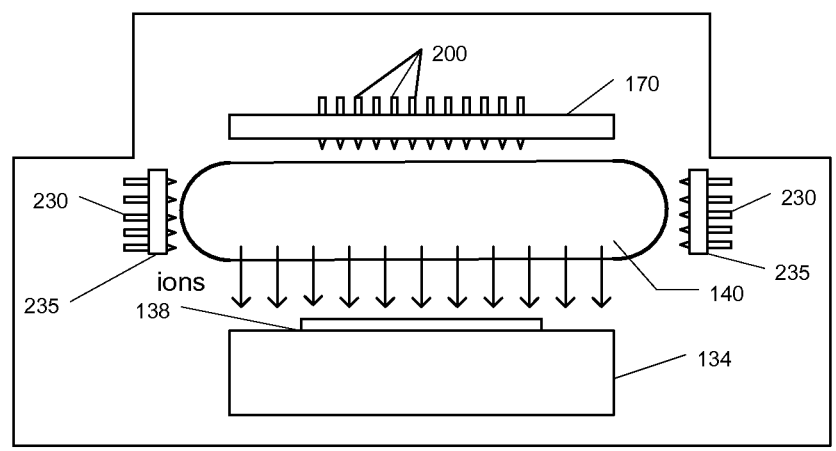
FIG. 7 represents a further embodiment of the apparatus of FIG. 2.

Furthermore, electrical conductors 230 may be placed vertically around the sides of the plasma, as shown in FIG. 7. Side baffles 235 are positioned about the sides of the plasma. A set of electrical conductors 230 is preferably located on the side of the side baffle 235. These conductors 230 are electrically insulated from one another and from the side baffle 235. Such a configuration may serve to better confine the plasma.

As noted above, the bias voltage applied to one or more pins may be constant (DC) or intermittent, such as pulsed. Additionally, the pulsed bias voltage may be positive or negative. Alternatively, the one or more pins may be floated or grounded, as desired. Applying the pulsed bias voltages to the pins has certain advantages over DC bias. Since the plasma electrons are sensitive to the positive bias voltages, DC bias may cause too much perturbation to the plasmas, such as causing plasma instability or redistribution of the plasma in some applications. In such cases, pulsed bias with small duty cycle (50% or less) can minimize the plasma perturbation while providing controllability of the plasma uniformity. The duration of each pulse may preferably be between microseconds and milliseconds in the order of magnitude.

As noted above, the bias voltage applied to one or more electrical conductors 200 may be positive or negative. Alternatively, one or more electrical conductors may be grounded or floated. If biased, the bias voltage may be a constant voltage, or varying. In certain embodiments, the bias voltage is a periodic waveform having a duty cycle. This duty cycle can be between microseconds and milliseconds in order of magnitude. Furthermore, the duty cycle can vary, such that the duration of the pulses can change based on the plasma density and the desired density. Thus, bias voltage waveform may change in duration, frequency, magnitude, duty cycle or polarity over time.

Although each pin maybe independently controlled, groups of pins can be grouped together in one or more groups, and different groups may be controlled independently of other groups. For example, pins removed from the center by the same distance may be controlled together if the density profile of the non-uniform plasma is radially symmetric. However, if the plasma density is asymmetric, each pin or each group of pins may be controlled independently.

Figure 5:
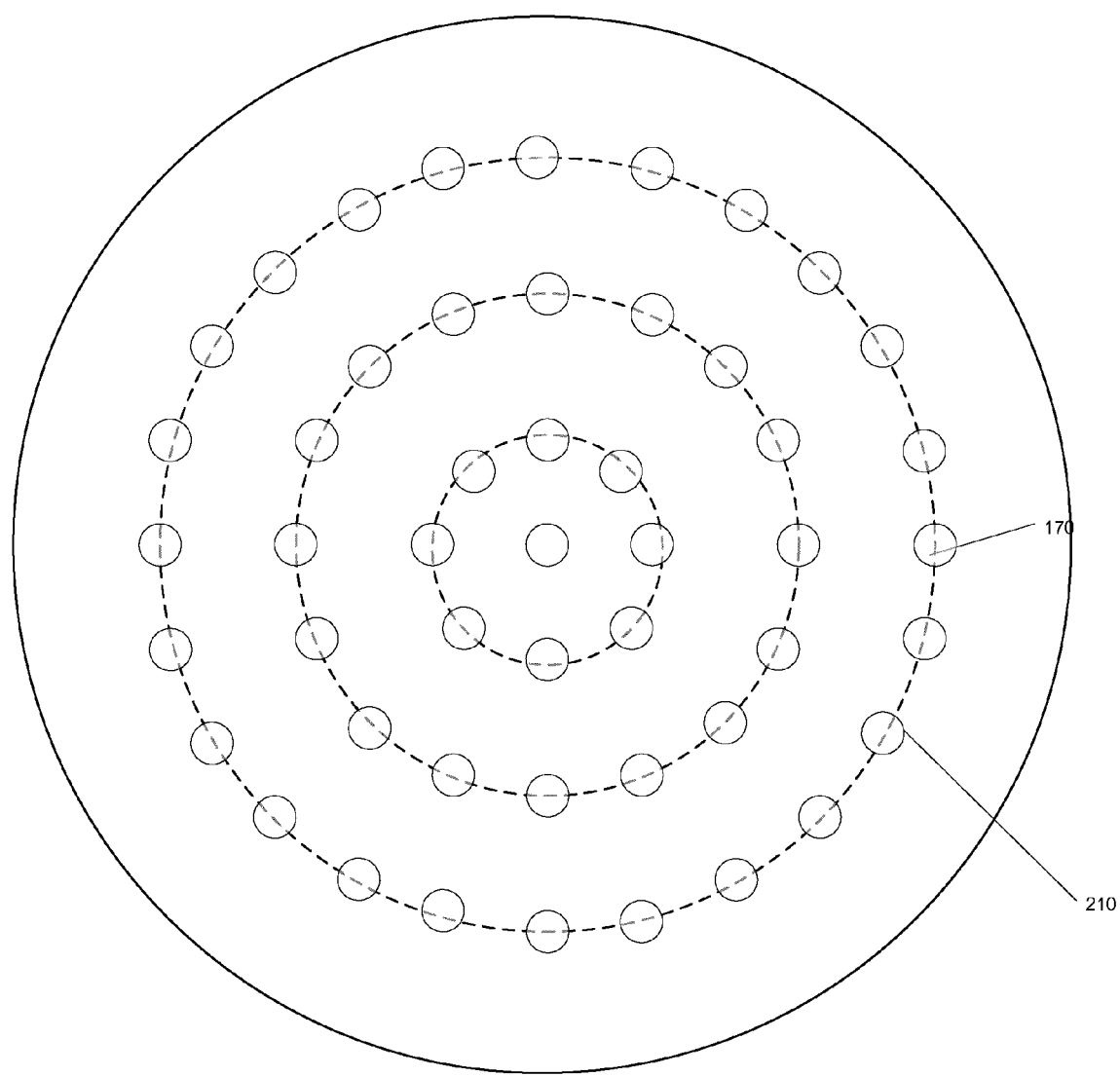
FIG. 5 represents a top view of a second embodiment of the apparatus of the present disclosure.

While the disclosure describes an array of pins as shown in FIG. 3, other embodiments are possible and within the scope of the disclosure. For example, another embodiment of the electrical biased elements is shown in FIG. 5. In this Figure, it is assumed that the plasma is symmetrical and therefore, the ion concentrations at a same distance from the center are all identical. Each concentric ring represents a set of electrically conductive elements 210, which can be biased independently of the adjacent rings. Thus, the same effect is desired, and therefore the same bias voltage can be applied. Other embodiments are also within the scope of the disclosure.

Figure 6:
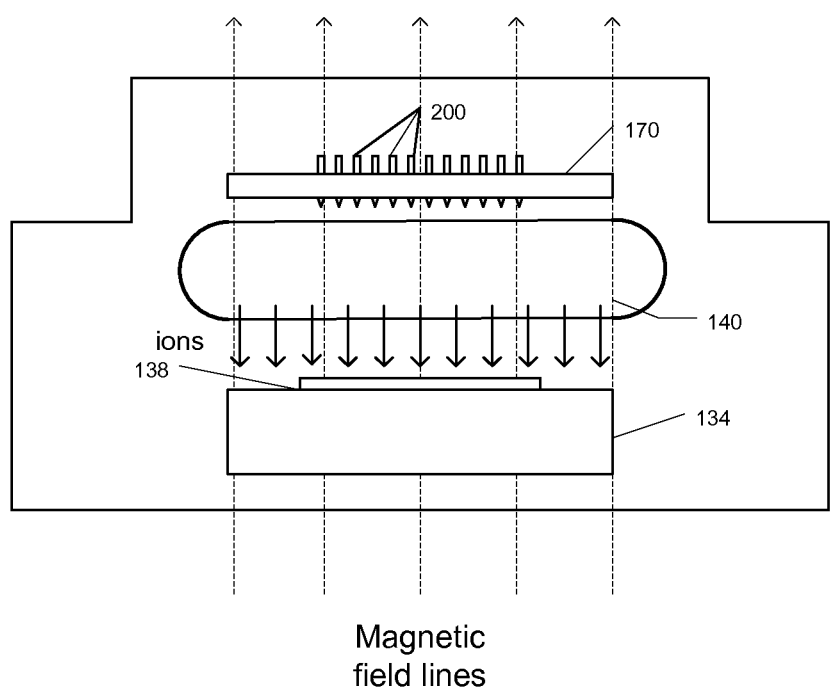
FIG. 6 represents the apparatus of FIG. 2 with an added magnetic field.

In addition to electrical fields, magnetic fields can be added to further improve the plasma uniformity and therefore implant uniformity. In the above embodiment, there was no magnetic field, thus charged particles are free to move in all directions. By introducing a magnetic field parallel to the electrical field, charged particles will be limited in their freedom of motion. Referring to FIG. 6, a magnetic field is added to the apparatus shown in FIG. 2 and is created parallel to the electrical field. In this embodiment, charged particles are more restricted in their movement, in that the charged particles are confined along the magnetic field lines. Thus the effect of the bias voltages described above is more contained. In other words, each electrically conductive element controls the ion concentration of the plasma in the volume located directly below the element. Thus, the bias voltages applied at one element do not affect the ion concentrations in other areas of the plasma.

The magnetic field can be created in a variety of ways, as are known by those skilled in the art.

Apparatus and method for improving plasma uniformity in a plasma based system are disclosed. Although the present disclosure has been described herein in the context of particular systems and particular implementations in particular environments for a particular purpose, the present disclosure is not limited thereto. Those of ordinary skill in the art will recognize that its usefulness is not limited thereto and that the present disclosure can be beneficially implemented in any number of environments for any number of purposes. For example, one or more electrical conductors near a portion of the plasma with greater ion or plasma density may be applied with a first bias voltage. The portion of the plasma with greater density may not necessarily be positioned in the inner or middle portion of the plasma. In some embodiments, the portion with greater density may be located at the outer or periphery portion of the plasma, the portion located between the inner portion and the chamber wall.

This first bias voltage, which applied to one or more electrical conductors near the portion of the plasma with greater density, may be a positive bias voltage. With this bias voltage, the positively charged ions near the electrical conductors may be dispersed away from the portion of the plasma with greater ion or plasma density. In the process, there may be a local decrease in plasma density in the portion. As a result, plasma with increased uniformity may be achieved.

Alternatively, one or more electrical conductors near another portion of the plasma with less ion or plasma density may be applied with a second bias voltage. The second bias voltage may be less positive than what the first bias voltage would have been. In one example, the second bias voltage may be a negative bias voltage. In another example, the second bias voltage may be a positive bias voltage, but less than what the first bias voltage would have been had the first bias voltage been applied to other conductors. With the application of negative bias voltage, the plasma may be compressed. In the process, the density of the less dense portion of the plasma may increase, and the uniformity of the plasma may be enhanced.

In another embodiment, one or more electrical conductors near a portion of the plasma with greater ion or plasma density may be applied with a first bias voltage. Meanwhile, one or more electrical conductors near another portion of the plasma with less ion or plasma density may be applied with a second bias voltage, less positive than the first bias voltage.

By independently applying one or more bias voltages to one or more electrical conductors, plasma with greater uniform density may be achieved.

Referring to FIG. 8A, there is shown another exemplary plasma processing apparatus 800 according to another embodiment of the present disclosure. In FIG. 8B, there is shown a plurality of electrical conductors 810 that may be included in the plasma processing apparatus 800 shown in FIG. 8A. Much like the earlier embodiment shown in FIG. 2, the plasma processing apparatus 800 contains a plasma source 101 for generating the plasma 140 in the chamber 102. In addition, the plasma processing apparatus 800 comprises a platen 134 for supporting a substrate 138. Those skilled in the art will recognize that several components in the plasma processing apparatus shown in FIGS. 1 and 2 are also contained in the plasma processing apparatus 800 of FIG. 8A.

Such components in FIG. 8A should be understood in relation to the same components in the plasma processing apparatus shown in FIGS. 1 and 2.

As illustrated in FIG. 8A the plasma processing apparatus 800 may comprise a plurality of electrical conductors 810 disposed at various positions within the plasma chamber 102. The electrical conductors 810 may be a part of or attached to the baffle 170, as shown in FIG. 2. In other embodiments, the electrical conductors 810 may be spaced apart from the baffle. For example, the electrical conductors 810 may be located below the baffle and closer to the plasma 140. Yet in another embodiment, the plasma processing system 800 may be without the baffle. In this embodiment, only the electrical conductors 810 are illustrated for clarity and simplicity.

The plurality of electrical conductors 810 may comprise at least one first or inner electrical conductor 810a disposed near the center of the chamber 102 or the inner portion of the plasma 140. The plurality of electrical conductors 810 may also comprise one or more second or outer electrical conductor 810b disposed near the outer portion of the plasma 140, the portion between the inner portion of the plasma and the chamber wall. In other embodiments, there may be one or more intermediate electrical conductors disposed between the inner and outer electrical conductors 810a and 810b. If included, the intermediate electrical conductors may comprise one or more third and fourth electrical conductors 810c and 810d positioned between the inner and outer conductors 810a and 810b.

Much like the prior embodiments, the first and second conductors 810a and 810b may be electrically isolated from each other. Moreover, each of the first conductors 810a, if two or more are provided, may be electrically isolated from each other. If two or more are provided, each of the second conductors 810b may also be electrically isolated from each other. Likewise, each of the third and fourth conductors 810c and 810d may also be electrically isolated from each other and from each of the first and second conductors 810a and 810b. Further, if two or more are included, each of the third conductors 810c and each of the fourth conductors 810d may be electrically isolated from each other.

Each of the first and second conductors 810a and 810b may be independently biased. If included, the third and fourth conductors 810c and 810d may also be independently biased. The bias voltage applied to the conductors 810a-810d may be a continuous or pulsed bias. Moreover, the bias voltage applied may be positive or negative bias voltage. In some embodiments, at least one of the first and second 810a and 810b, and the third and fourth conductors 810c and 810d if included, may remain floating or grounded.

In operation, a plasma source 101 in the plasma doping system 800 may generate a plasma 140 between the workpiece 138 and the electrical conductors 810. However, the present disclosure does not preclude generating a plasma above the first and second conductors 810a and 810b. The plasma 140 generated in the chamber 102 may have a density profile similar to the profile shown in FIG. 8C. For example, the plasma 140 may have higher ion density near its inner portion and less ion density near its outer portion.

To improve the uniformity, a bias voltage may be provided to one of more of the first and second electrical conductors 810a and 810b. In the present embodiment, a first bias voltage may be applied to the first conductor 810a. This first bias voltage may be a positive bias voltage. If applied with a positive bias voltage, the first electrical conductor 810a may locally disperse the positively charged ions away from the inner portion of the plasma 140. As a result, the difference in the plasma density between the inner portion of the plasma 140 and the outer portion of the plasma 140 may decrease, and the uniformity of the plasma 140 may improve.

Alternatively, the second conductor 810b may also be applied with the bias voltage. In the present embodiment, the bias voltage applied to the second electrical conductor 810b may be a second, less positive voltage. For example, the second electrical conductor 810b may be biased with negative bias voltage. By applying a negative bias voltage to the second conductor 810b, the outer portion of the plasma 140 with less plasma density may be compressed. As such, further improvement to the uniformity of the plasma 140 may be achieved.

In another embodiment, both the first and second conductors 810a and 810b may be independently biased with the first and second bias voltages. In this embodiment, the dispersion of ions from the portion of the plasma with greater density and the compression of the portion of the plasma with less density may occur. When both bias voltages are applied, they may be applied simultaneously or at different times.

If included, the third and fourth electrodes 810c and 810d may also be biased. If biased, the third electrode 810c may be biased with less positive bias than the first electrode 810a, but more positive bias than the second electrode 810b. Meanwhile, the fourth electrode 810d, if biased, may be biased with less positive bias than the third electrode 810c, but more positive than the bias voltage applied to the second electrode 810b. By applying the most positive bias voltage to the electrical conductor near the portion of the plasma with greatest ion density, the uniformity of the plasma, as a whole, may be improved. To enhance the improvement in the uniformity, less positive voltage may be applied to one or more electrical conductors near the portion of the plasma with less plasma density.

Figure 9A:
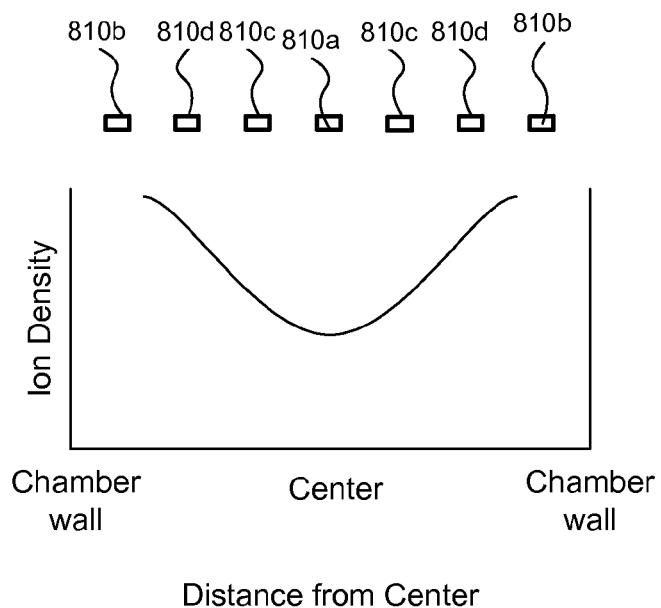
FIGS. 9A and 9B illustrate several exemplary operations of the apparatus shown in FIG. 8A.
Figure 9B:
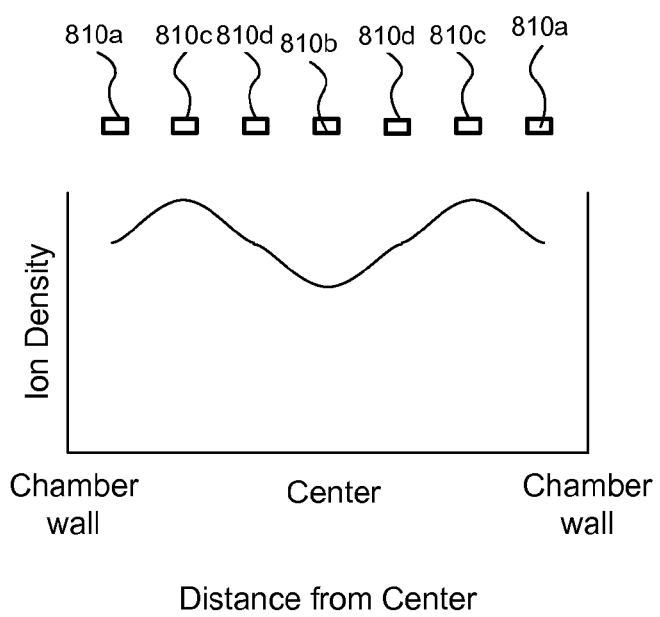

Those of ordinary skill in the art will recognize that the plasma processing apparatus 800 may also be used for improving the uniformity of plasma having different density profiles. In one example, the density profile of the plasma is such that the outer portion has a greater density and the inner portion of the plasma has less density, as shown in FIG. 9A. In such an embodiment, the second electrical conductor 810b near the outer portion of the plasma may be biased with a positive bias voltage. Alternatively or in addition, the first electrical conductor 810a may be biased with less positive bias voltage. In another example, the density profile of the plasma is such that the inner portion and the outer portion of the plasma have less ion density than a portion of the plasma therebetween, as shown in FIG. 9B. In such an example, the electrical conductors near the portion of the plasma with greater ion density may be biased with more positive bias voltage. Meanwhile, the electrical conductors near the portion of the plasma with less ion density may be applied with less positive bias voltage. In the process, the plasma with non-uniform ion density may be made more uniform. By independently applying the bias voltage and controlling the applied bias voltage, the electrical conductors of the present disclosure may locally control the plasma density and improve the plasma uniformity.

Figure 10A:
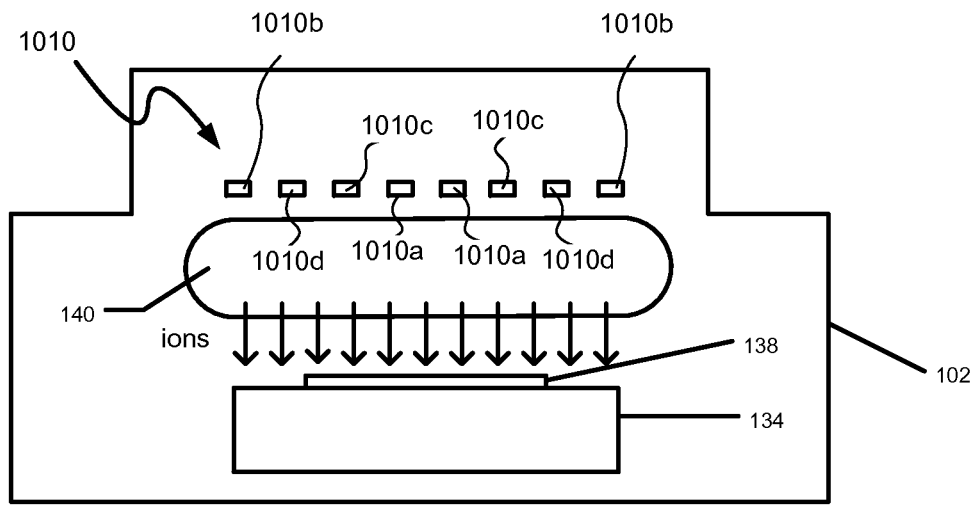
FIG. 10A illustrates another exemplary apparatus according to another embodiment of the present disclosure.
Figure 10B:
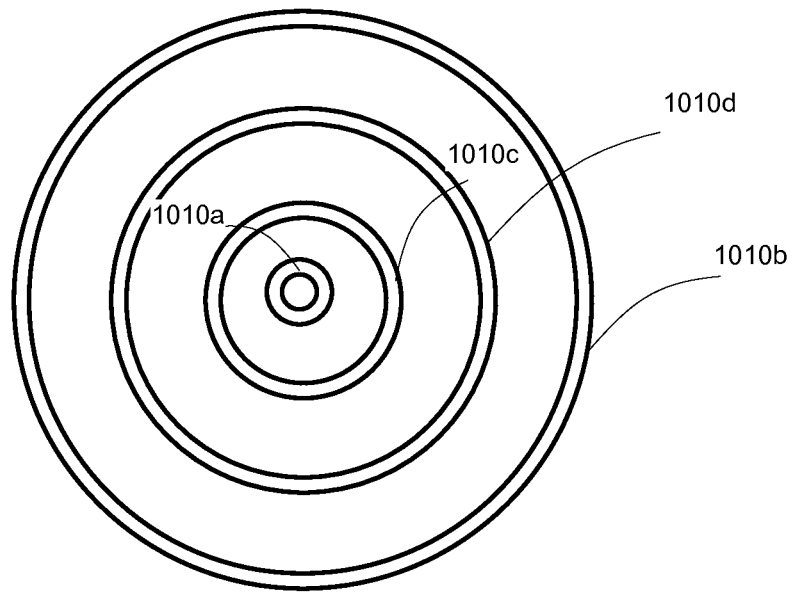
FIG. 10B illustrates a plurality of another exemplary electrodes incorporated in the apparatus shown in FIG. 10A.

Referring to FIG. 10A, there is shown a plasma processing system 1000 according to another embodiment of the present disclosure. In FIG. 10B, there is shown a plurality of electrical conductors 1010 that may be included in the plasma processing system shown in FIG. 10A. As shown in FIG. 10B, the electrical conductors 1010 may comprise a first electrical conductor 1010a disposed near the inner portion of the plasma 140, and a second electrical conductor 1010b disposed near the outer portion of the plasma 140. Optionally, there may be one or more intermediate electrical conductors.

In the present embodiment, the intermediate electrical conductors may comprise a third electrical conductor 1010c and a fourth electrical conductor 1010d, disposed between the first and second electrical conductor 1010a and 101b.

As shown in FIG. 10A, the first conductor 1010a may be disposed near the inner portion of the plasma 140, whereas the second conductor 1010b may be disposed near the outer portion of the plasma 140. In addition, the second electrical conductor 1010b may be configured to surround the first conductor 1010a. Although not necessary, the first and second conductors 1010a and 1010b of the present embodiment may be concentric. In some other embodiments, the first and second conductors 1010a and 1010b may have shapes other than circular shape as shown in FIG. 10A.

Much like the prior embodiments, the first and second conductors 1010a and 1010b may be electrically isolated from each other. If included, each of the third and fourth conductors 1010c and 1010d may also be electrically isolated from each other and from each of the first and second conductors 1010a and 1010b. In addition, each of the first and second conductors 1010a and 1010b may be independently biased. If included, the third and fourth conductors 1010c and 1010d may also be independently biased. Each conductor 1010a-1010d may be independently biased with a continuous or pulsed with bias voltage. The bias voltage applied may be positive or negative. Or, at least one of the first and second conductors 1010a and 1010b, and the third and fourth conductors 1010c and 1010d, if included, may remain floating or grounded.

In an exemplary operation, a plasma source 101 in a plasma doping system shown in FIGS. 1 and 2 may generate a plasma 140 with non-uniform density shown in FIG. 4. To improve the uniformity, a bias voltage may be provided to one of more of the first and second electrical conductors 1010a and 1010b. For example, if the plasma 140 has higher ion density near its inner portion, as shown in FIG. 4, a first positive bias voltage may be provided to the first conductor 1010a. With the positive bias voltage, the first electrical conductors 1010a near the inner portion of the plasma 140 may disperse the positively charged ions away from the inner portion of the plasma 140, toward the outer portion of the plasma 140. As a result, the uniformity of the plasma 140 may improve.

Alternatively, the second conductor 1010b may be applied with a bias voltage that is less positive than what the first bias voltage would have been had the first bias voltage been also applied to the first conductor 1010a. For example, the second conductor 1010b may be applied with negative bias voltage. With the application of negative bias voltage, the plasma may be compressed, and the density of the less dense portion of the plasma may increase. In the process, the uniformity of the plasma may be enhanced.

In some embodiments, both the first and second conductors 1010a and 1010b may be independently biased. In this embodiment, the first conductor 1010a may be applied with a first, positive bias voltage, and the second conductor 1010b may be applied with a second, less positive (e.g. negative) bias voltage.

If included, the third and fourth electrical conductors 1010c and 1010d may also be applied with bias voltage. To increase the uniformity of the plasma such as the plasma shown in FIG. 4, the third and fourth electrical conductors 1010c and 1010d may be biased with less positive bias voltage than the first electrical conductor 1010a, but more positive bias voltage than the second electrical conductor 1010b. In addition, the third electrical conductor 1010c may be biased with more positive bias voltage than the fourth electrical conductor 1010d. In the process, a plasma with more uniform ion density, as shown in FIG. 8, may be achieved.

Although the present disclosure has been described herein in the context of particular systems and particular implementations in particular environments for a particular purpose, the present disclosure is not limited thereto. Those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

What is claimed is:

1. A method of processing a workpiece, the method comprising:
   providing the workpiece in a chamber;
   providing a plurality of electrodes between a top of the chamber and the workpiece;
   generating a plasma containing ions between the plurality of electrodes and the workpiece, an ion density in an inner portion of the plasma being greater than the ion density in an outer portion of the plasma portion, the outer portion being between the inner portion and a wall of the chamber; and
   providing a bias voltage to the plurality of electrodes and dispersing at least a portion of the ions in the inner portion so that the ion density in the inner portion is substantially equal to the ion density in the outer portion.

2. The method according to claim 1, the method further comprising:
   attracting ions to the workpiece from the inner and outer portions of the plasma.

3. The method according to claim 1, wherein the providing the bias voltage to the plurality of electrodes comprises independently biasing the plurality of electrodes.

4. The method according to claim 1, wherein the providing the bias voltage to the plurality of electrodes comprises positively biasing the plurality of electrodes.

5. The method according to claim 1, wherein the providing the bias voltage to the plurality of electrodes comprises negatively biasing the plurality of electrodes.

6. The method according to claim 1, the method further comprising:
   coupling the plurality of electrodes to one or more power supplies, wherein the one or more power supplies provide a pulsed bias voltage having a duty cycle.

7. The method according to claim 6, the method further comprising:
   adjusting the duty cycle of the pulsed bias voltage provided to the plurality of electrodes.

8. The method according to claim 1, the method further comprising:
   providing a magnetic field in same direction as an electric field created by the biasing the plurality of electrodes.

9. The method according to claim 1, wherein the plurality of electrodes comprises a first electrode disposed above the inner portion of the plasma and a second electrode disposed above the outer portion of the plasma, and wherein the first electrode is applied with a first bias voltage and the second electrode is applied with a second bias voltage.

10. The method according to claim 9, wherein the first bias voltage is more positive than the second bias voltage.

11. The method according to claim 9, wherein the first bias voltage is less positive than the second bias voltage.

12. The method according to claim 11, wherein the providing the bias voltage to the first and second electrodes comprises biasing the first electrodes with a first bias voltage and the second electrodes with a second bias voltage.

13. The method according to claim 12, wherein the first bias voltage is more positive than the second bias voltage.

14. The method according to claim 12, wherein the first bias voltage is less positive than the second bias voltage.

15. A method of processing a workpiece, the method comprising:
providing the workpiece in a plasma chamber;
providing first and second electrodes between a top of the plasma chamber and the workpiece;
generating a plasma containing ions between the first and second electrodes and the workpiece, the plasma comprising a first plasma portion disposed beneath the first electrodes and a second plasma portion disposed beneath the second electrode, wherein the first plasma portion has greater ion density than the second plasma portion;
providing a bias voltage to the first and second electrodes and dispersing at least a portion of the ions in the first plasma portion so that the ion density in the first plasma portion is substantially equal to the ion density in the second plasma portion; and
biasing the workpiece and attracting ions to the workpiece from the first and second portions of the plasma having substantially equal ion density.

16. The method according to claim 15, wherein the first plasma portion is disposed closer to a middle of the plasma than the second plasma portion and wherein the second plasma portion is disposed closer to a periphery of the plasma than the first plasma portion.

17. The method according to claim 15, wherein the second plasma portion is disposed closer to a middle of the plasma than the first plasma portion and wherein the first plasma portion is disposed closer to a periphery of the plasma than the second plasma portion.

18. The method according to claim 15, wherein the providing the bias voltage to the first and second electrodes comprises independently biasing at least one of the plurality of electrodes.

19. The method according to claim 15, wherein the providing the bias voltage to the first and second electrodes comprises positively biasing at least one of the plurality of electrodes.

20. The method according to claim 15, wherein the providing the bias voltage to the first and second electrodes comprises negatively biasing at least one of the plurality of electrodes.

* * * * *